United States Patent
Yoo

(10) Patent No.: US 12,157,526 B2
(45) Date of Patent: Dec. 3, 2024

(54) FOUR-WHEEL STEERING CONTROL APPARATUS AND METHOD

(71) Applicant: HYUNDAI MOBIS CO., LTD., Seoul (KR)

(72) Inventor: Sung Bem Yoo, Yongin-si (KR)

(73) Assignee: Hyundai Mobis Co., Ltd., Seoul (KR)

(*) Notice: Subject to any disclaimer, the term of this patent is extended or adjusted under 35 U.S.C. 154(b) by 270 days.

(21) Appl. No.: 17/712,685

(22) Filed: Apr. 4, 2022

(65) Prior Publication Data

US 2023/0202557 A1 Jun. 29, 2023

(30) Foreign Application Priority Data

Dec. 28, 2021 (KR) .................. 10-2021-0190453

(51) Int. Cl.
*B62D 6/00* (2006.01)
*G06F 30/20* (2020.01)

(52) U.S. Cl.
CPC ............. *B62D 6/002* (2013.01); *B62D 6/001* (2013.01); *G06F 30/20* (2020.01)

(58) Field of Classification Search
CPC ...... B62D 6/002; B62D 6/001; B62D 7/1509; B62D 7/159; B62D 7/14; B62D 5/0463; B62D 6/007; G06F 30/20; B60Y 2400/84
See application file for complete search history.

(56) References Cited

U.S. PATENT DOCUMENTS

| | | | | |
|---|---|---|---|---|
| 6,334,656 B1* | 1/2002 | Furukawa | ............. | B60T 8/1755 |
| | | | | 303/146 |
| 6,549,835 B2* | 4/2003 | Deguchi | ................ | B62D 7/159 |
| | | | | 180/408 |
| 6,865,461 B2* | 3/2005 | Neef | ...................... | B62D 7/159 |
| | | | | 701/41 |

(Continued)

FOREIGN PATENT DOCUMENTS

DE 690 05 148 T2 5/1994
DE 602 24 618 T2 12/2008
(Continued)

OTHER PUBLICATIONS

Dudzinski, Piotr. "Lenksysteme für Nutzfahrzeuge.", Springer-Verlag, 2005., ISBN 3-540-22788-1 (12 pages in German).
(Continued)

*Primary Examiner* — Kurt Philip Liethen
(74) *Attorney, Agent, or Firm* — NSIP Law

(57) ABSTRACT

An apparatus including a command front wheel angle acquirer to acquire a command front wheel angle, a four-wheel target angle calculator to calculate a turning radius, which is a distance from a center of rotation when a vehicle is turning to a center of gravity in a Bicycle model, using the model in a state in which a front wheel angle of the model is simulated as the command front wheel angle, to calculate a rotation angle at the center of gravity of the model on the basis of a ratio of rotation angles of front and rear wheels of the vehicle calculated from a state parameter of the vehicle, (Continued)

and to calculate a target angle of each of the four wheels on the basis of the turning radius and the rotation angle, and a controller to independently control steering of the four wheels using the calculated each target angle.

20 Claims, 10 Drawing Sheets

(56) References Cited

U.S. PATENT DOCUMENTS

| | | | | |
|---|---|---|---|---|
| 6,871,125 | B2* | 3/2005 | Oshima | B60L 15/2036 |
| | | | | 701/41 |
| 2003/0028301 | A1 | 2/2003 | Sebastian et al. | |
| 2003/0105563 | A1 | 6/2003 | Oshima et al. | |
| 2008/0114514 | A1 | 5/2008 | Auguet et al. | |
| 2008/0177445 | A1* | 7/2008 | Auguet | B62D 6/003 |
| | | | | 701/42 |
| 2016/0200360 | A1* | 7/2016 | Moshchuk | B62D 6/002 |
| | | | | 701/41 |
| 2017/0267285 | A1 | 9/2017 | Abbas et al. | |
| 2019/0155229 | A1* | 5/2019 | Herrera | B60W 50/00 |
| 2020/0172165 | A1* | 6/2020 | Chen | B62D 15/025 |
| 2021/0403049 | A1* | 12/2021 | Funke | B62D 6/002 |

FOREIGN PATENT DOCUMENTS

| | | |
|---|---|---|
| DE | 10 2017 105 772 A1 | 9/2017 |
| EP | 0 384 400 B1 | 8/1990 |
| JP | 2003-146234 A | 5/2003 |
| KR | 10-2007-0116284 A | 12/2007 |
| KR | 10-2010-0032244 A | 3/2010 |

OTHER PUBLICATIONS

German Office Action issued on Dec. 7, 2022, in counterpart German Patent Application No. 10 2022 109 861.3 (5 pages in German).

Korean Office Action issued on Nov. 10, 2023, in counterpart Korean Patent Application No. 10-2021-0190453 (6 pages in Korean).

* cited by examiner

FOUR-WHEEL STEERING CONTROL APPARATUS AND METHOD

CROSS-REFERENCE TO RELATED APPLICATION

This application claims priority from and the benefit of Korean Patent Application No. 10-2021-0190453, filed on Dec. 28, 2021, which is hereby incorporated by reference for all purposes as if set forth herein.

BACKGROUND

Field

The following description relates to a four-wheel steering control apparatus and method, and more particularly, to a four-wheel steering control apparatus and method for independently controlling the steering of four wheels.

Discussion of Related Art

An active front steering (AFS) system applied to a vehicle is provided with a steering gear ratio variable device between a steering wheel and a steering actuator, receives a steering angle of the steering wheel, outputs a varied rotation angle to an AFS actuator, and varies a steering gear ratio, thereby providing front wheel steering responsiveness and driving stability. In addition, a rear wheel steering (RWS) system receives the steering angle of the steering wheel, a vehicle speed, and the like, determines a rear wheel angle, and drives an RWS actuator to control the rear wheel angle, thereby providing rear wheel steering responsiveness and driving stability.

Recently, research into a technology of independently controlling the steering of four wheels mounted on a vehicle is conducted in order to secure the degree of freedom of driving of the vehicle such as parallel driving (for example, parallel parking), diagonal driving (for example, diagonal parking), or turning in place. In the case of two-wheel steering (or front-wheel steering), two front wheels are mechanically coupled to each other through an Ackerman geometry model to achieve front-wheel steering, whereas in the case of four-wheel independent steering, since respective wheels are not mechanically coupled to one another, the angles of the respective wheels need to be independently controlled.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a four-wheel four-wheel independent steering control apparatus, the apparatus including a command front wheel angle acquirer configured to acquire a command front wheel angle, a four-wheel target angle calculator configured to calculate a turning radius using a Bicycle model in a state in which a front wheel angle of the Bicycle model is simulated as the command front wheel angle, calculate a rotation angle at the center of gravity of the Bicycle model on the basis of a ratio of rotation angles of front and rear wheels of a vehicle calculated from a state parameter of the vehicle, and calculate a target angle of each of four wheels of the vehicle on the basis of the turning radius and the rotation angle, and a controller configured to independently control steering of the four wheels by using the calculated each target angle, wherein the turning radius is a distance from a center of rotation when the vehicle is turning to a center of gravity in the Bicycle model defined for the vehicle.

The four-wheel target angle calculator may be configured to calculate the turning radius based on a distance from a front axle to a rear axle in the Bicycle model, a reference rotation angle at the center of gravity of the Bicycle model when the rear wheels are in a neutral state in the Bicycle model, and the command front wheel angle.

The four-wheel target angle calculator may be configured to calculate the rotation angle at the center of gravity of the Bicycle model using the ratio of the rotation angles, and a reference front wheel angle and a reference rear wheel angle respectively established through first and second parameters in the Bicycle model, and the first parameters may include a distance from the front axle to the center of gravity of the Bicycle model and a distance from the center of gravity to the reference point in the Bicycle model, and the second parameters may include a distance from the rear axle to the center of gravity of the Bicycle model and the distance from the center of gravity to the reference point in the Bicycle model, in response to a foot of a perpendicular drawn from the center of rotation to a straight line connecting the front and rear axles in the Bicycle model being defined as a reference point.

The rotation angle at the center of gravity of the Bicycle model may be calculated as different values according to whether the front wheels and the rear wheels of the Bicycle model are in-phase or opposite phase determined through the ratio of the rotation angles.

The four-wheel target angle calculator may be configured to calculate a target angle of a left front wheel and a target angle of a right front wheel by using the first parameters and third parameters, and to calculate a target angle of a left rear wheel and a target angle of a right rear wheel by using the second parameters and the third parameters, and wherein the third parameters may include a reference distance calculated from the turning radius and the rotation angle, and a tread of the vehicle.

The four-wheel target angle calculator may be configured to calculate the target angle of each of the four wheels based on $$WA_{FL} = \tan^{-1}\left(\frac{a+c}{R_r - \frac{W}{2}}\right) \times \text{sign}(FWA)$$

$$WA_{FR} = \tan^{-1}\left(\frac{a+c}{R_r + \frac{W}{2}}\right) \times \text{sign}(FWA)$$

$$WA_{RL} = \tan^{-1}\left(\frac{c-b}{R_r - \frac{W}{2}}\right) \times \text{sign}(FWA)$$

$$WA_{RR} = \tan^{-1}\left(\frac{c-b}{R_r + \frac{W}{2}}\right) \times \text{sign}(FWA)$$

wherein $WA_{FL}$ may be the target angle of the left front wheel, $WA_{FR}$ may be the target angle of the right front wheel, $WA_{RL}$ may be the target angle of the left rear wheel, $WA_{RR}$ may be the target angle of the right rear wheel, a may be the distance from the front axle to the center of gravity of the Bicycle model, b may be the distance from the rear axle to the center of gravity of the Bicycle model, c may be the distance from the center of gravity to the reference point in the Bicycle model, $R_r$ may be the reference distance, W may be the tread, and sign (FWA) may be a sign of the command front wheel angle.

The apparatus may include a steering mode determiner configured to determine any one of a general mode, an in-place turning mode, a parallel mode, and a diagonal mode as a steering mode for controlling the steering of the four wheels, wherein the four-wheel target angle calculator may be configured to calculate the turning radius, to calculate the rotation angle at the center of gravity of the Bicycle model, and to calculate the target angle of each of the four wheels, in response to the general mode being determined by the steering mode determiner.

The four-wheel target angle calculator may be configured to calculate the target angle of each of the four wheels on the basis of a distance from a front axle to a rear axle of the vehicle and the tread, in response to the in-place turning mode being determined by the steering mode determiner.

The four-wheel target angle calculator may be configured to calculate an absolute value of the target angle of each of the four wheels as 90°, in response to the parallel mode being determined by the steering mode determiner.

The four-wheel target angle calculator may be configured to calculate the target angle of each of the four wheels as the command front wheel angle, in response to the diagonal mode being determined by the steering mode determiner.

In another general aspect, there is provided a processor-implemented method for four-wheel independent steering control, the method including acquiring, at a command front wheel angle acquirer, a command front wheel angle, calculating, at a four-wheel target angle calculator, a turning radius using a Bicycle model in a state in which a front wheel angle of the Bicycle model is simulated as the command front wheel angle, calculating, at the four-wheel target angle calculator, a rotation angle at the center of gravity of the Bicycle model on the basis of a ratio of rotation angles of front and rear wheels of the vehicle calculated from a state parameter of a vehicle, calculating, at a four-wheel target angle calculator, a target angle of each of four wheels of the vehicle on the basis of the turning radius and the rotation angle, and a controller independently controls steering of the four wheels by using the calculated each target angle, wherein the turning radius is a distance from a center of rotation when the vehicle is turning to a center of gravity in a Bicycle model defined for the vehicle.

The calculating of the turning radius may include calculating the turning radius based on the a distance from a front axle to a rear axle in the Bicycle model, a reference rotation angle at the center of gravity of the Bicycle model when the rear wheels are in a neutral state in the Bicycle model, and the command front wheel angle.

The calculating of the rotation angle may include calculating, at the four-wheel target angle calculator, the rotation angle at the center of gravity of the Bicycle model using the ratio of the rotation angles, and a reference front wheel angle and a reference rear wheel angle respectively established through first and second parameters in the Bicycle model, and the first parameters may include a distance from the front axle to the center of gravity of the Bicycle model and a distance from the center of gravity to the reference point in the Bicycle model, and the second parameters may include a distance from the rear axle to the center of gravity of the Bicycle model and the distance from the center of gravity to the reference point in the Bicycle model, in response to a foot of a perpendicular drawn from the center of rotation to a straight line connecting the front and rear axles in the Bicycle model being defined as a reference point.

The rotation angle at the center of gravity of the Bicycle model may be calculated as different values according to whether the front wheels and the rear wheels of the Bicycle model are in-phase or opposite phase determined through the ratio of the rotation angles.

The calculating of the target angle may include calculating, at the four-wheel target angle calculator, a target angle of a left front wheel and a target angle of a right front wheel by using the first parameters and third parameters, and calculating a target angle of a left rear wheel and a target angle of a right rear wheel using the second parameters and the third parameters, and wherein the third parameters may include a reference distance calculated from the turning radius and the rotation angle, and a tread of the vehicle.

The calculating of the target angle may include calculating, at the four-wheel target angle calculator, the target angle of each of the four wheels based on $$WA_{FL} = \tan^{-1}\left(\frac{a+c}{R_r - \frac{W}{2}}\right) \times \text{sign}(FWA)$$

$$WA_{FR} = \tan^{-1}\left(\frac{a+c}{R_r + \frac{W}{2}}\right) \times \text{sign}(FWA)$$

$$WA_{RL} = \tan^{-1}\left(\frac{c-b}{R_r - \frac{W}{2}}\right) \times \text{sign}(FWA)$$

$$WA_{RR} = \tan^{-1}\left(\frac{c-b}{R_r + \frac{W}{2}}\right) \times \text{sign}(FWA)$$

wherein $WA_{FL}$ may be the target angle of the left front wheel, $WA_{FR}$ may be the target angle of the right front wheel, $WA_{RL}$ may be the target angle of the left rear wheel, $WA_{RR}$ may be the target angle of the right rear wheel, a may be the distance from the front axle to the center of gravity of the Bicycle model, b may be the distance from the rear axle to the center of gravity of the Bicycle model, c may be the distance from the center of gravity to the reference point in the Bicycle model, $R_r$ may be the reference distance, W may be the tread, and sign (FWA) may be a sign of the command front wheel angle.

The method may include determining, at a steering mode determiner, any one of a general mode, an in-place turning mode, a parallel mode, and a diagonal mode as a steering mode for controlling the steering of the four wheels, wherein the calculating of the turning radius, the calculating of the rotation angle, and the calculating of the target angle may include calculating the turning radius, calculating the rotation angle, and calculating of the target angle, in response to the general mode being determined by the steering mode determiner.

The method may include calculating, at the four-wheel target angle calculator, the target angle of each of the four wheels on the basis of a distance from a front axle to a rear axle of the vehicle and the tread, in response the in-place turning mode being determined by the steering mode determiner.

The method may include calculating, at the four-wheel target angle calculator, an absolute value of the target angle of each of the four wheels as 90°, in response to the parallel mode being determined by the steering mode determiner.

The method may include calculating, at the four-wheel target angle calculator, the target angle of each of the four wheels as the command front wheel angle, in response to the diagonal mode being determined by the steering mode determiner.

Other features and aspects will be apparent from the following detailed description, the drawings, and the claims.

Figure 1:
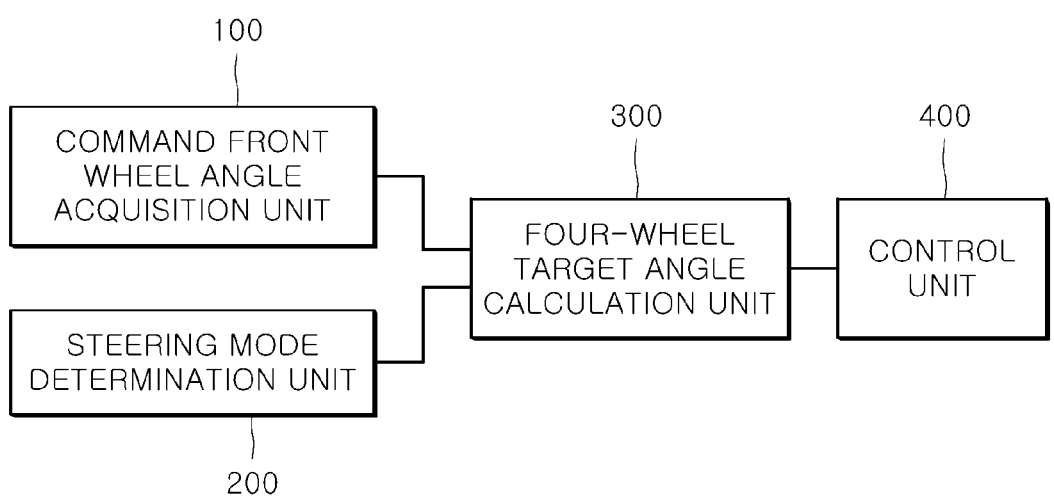
FIG. 1 is a block diagram illustrating a four-wheel steering control apparatus in accordance with the present embodiment.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION OF THE ILLUSTRATED EMBODIMENTS

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Terms, such as first, second, A, B, (a), (b) or the like, may be used herein to describe components. Each of these terminologies is not used to define an essence, order or sequence of a corresponding component but used merely to distinguish the corresponding component from other component(s). For example, a first component may be referred to as a second component, and similarly the second component may also be referred to as the first component.

Throughout the specification, when a component is described as being "connected to," or "coupled to" another component, it may be directly "connected to," or "coupled to" the other component, or there may be one or more other components intervening therebetween. In contrast, when an element is described as being "directly connected to," or "directly coupled to" another element, there can be no other elements intervening therebetween.

The singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or populations thereof.

Figure 2:
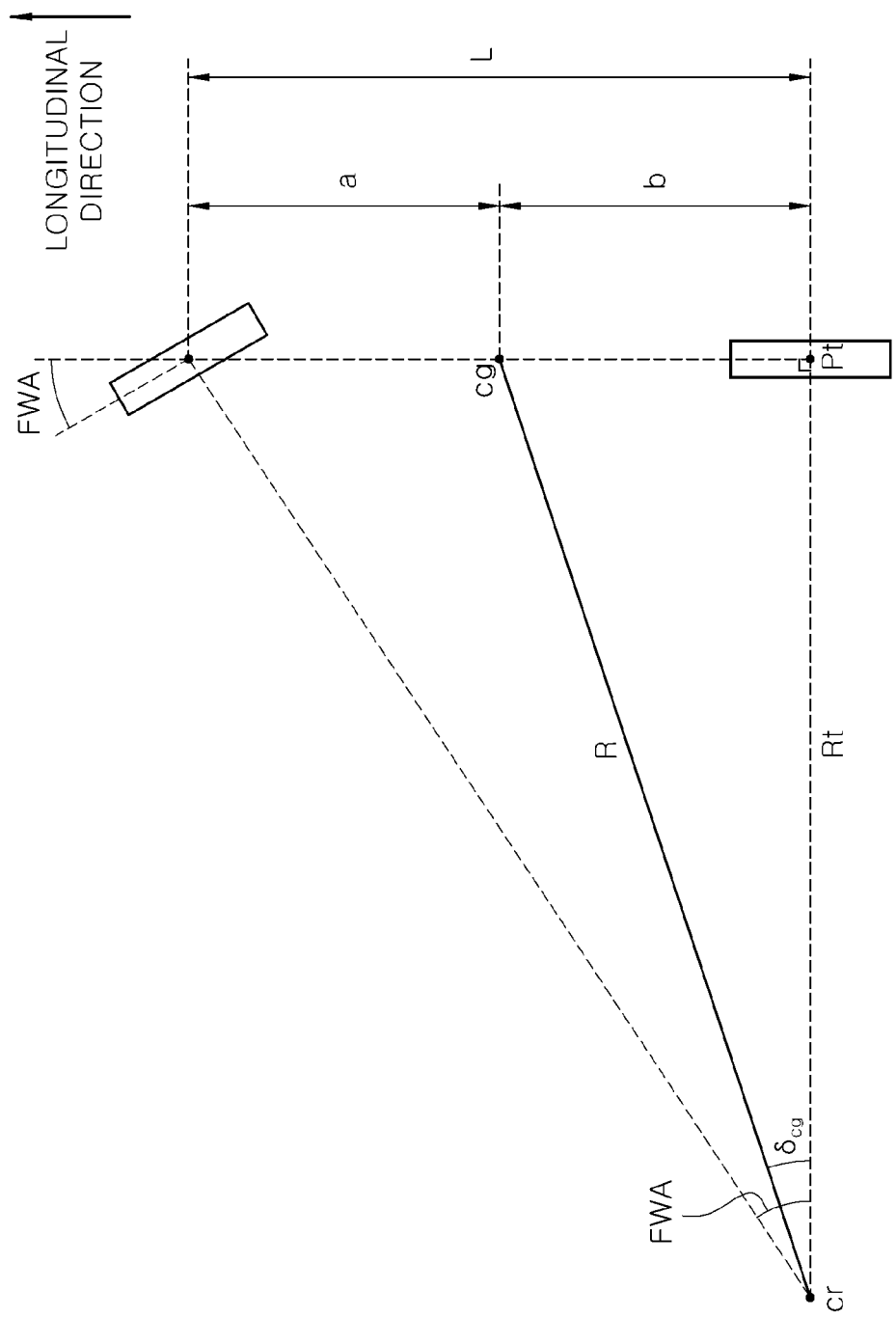
FIG. 2 is a diagram illustrating a process in which the four-wheel steering control apparatus in accordance with the present embodiment calculates a turning radius by using a Bicycle model.
Figure 3:
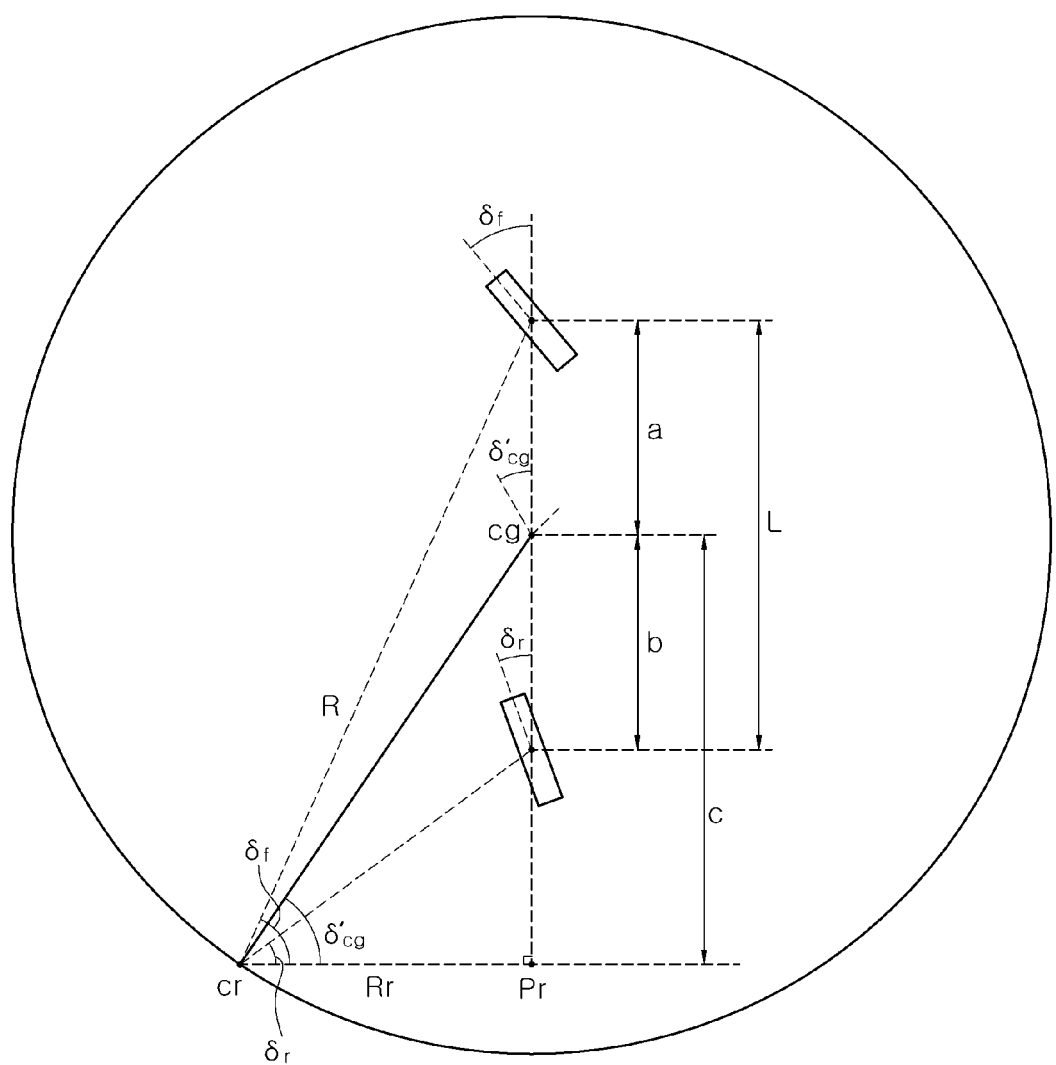
FIG. 3 and FIG. 4 are diagrams illustrating a process in which the four-wheel steering control apparatus in accordance with the present embodiment calculates a rotation angle.
Figure 4:
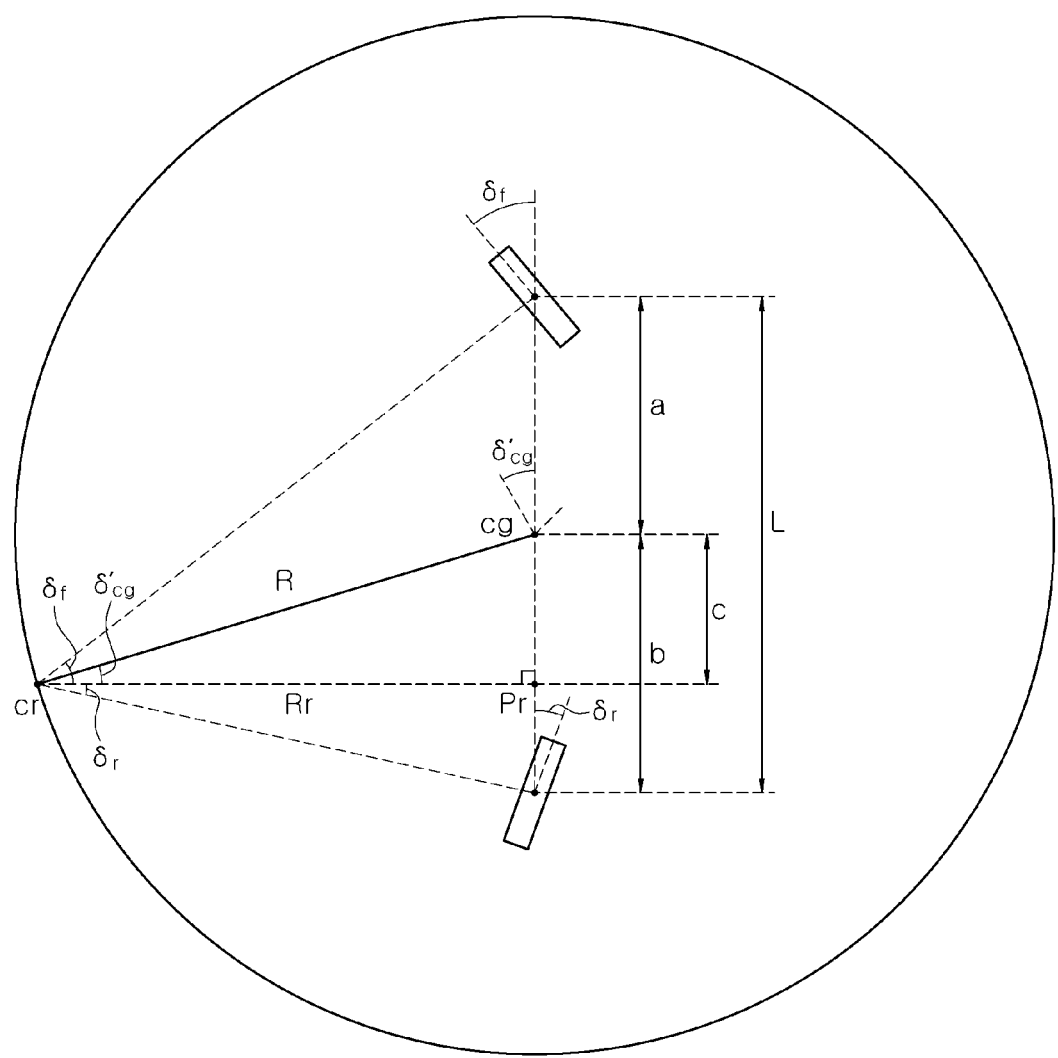
Figure 5:
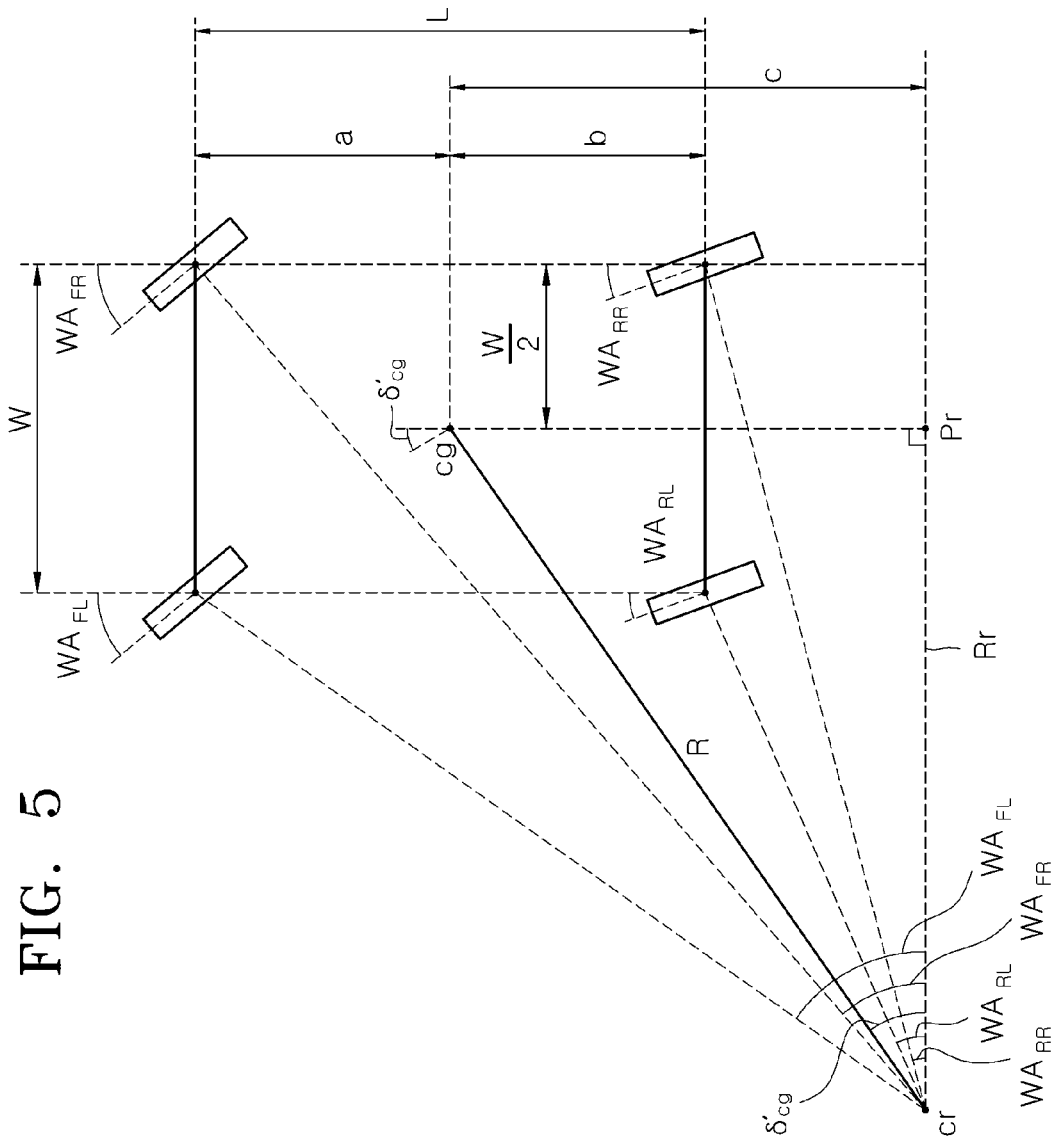
FIG. 5 and FIG. 6 are diagrams illustrating a process in which the four-wheel steering control apparatus in accordance with the present embodiment calculates target angles.
Figure 6:
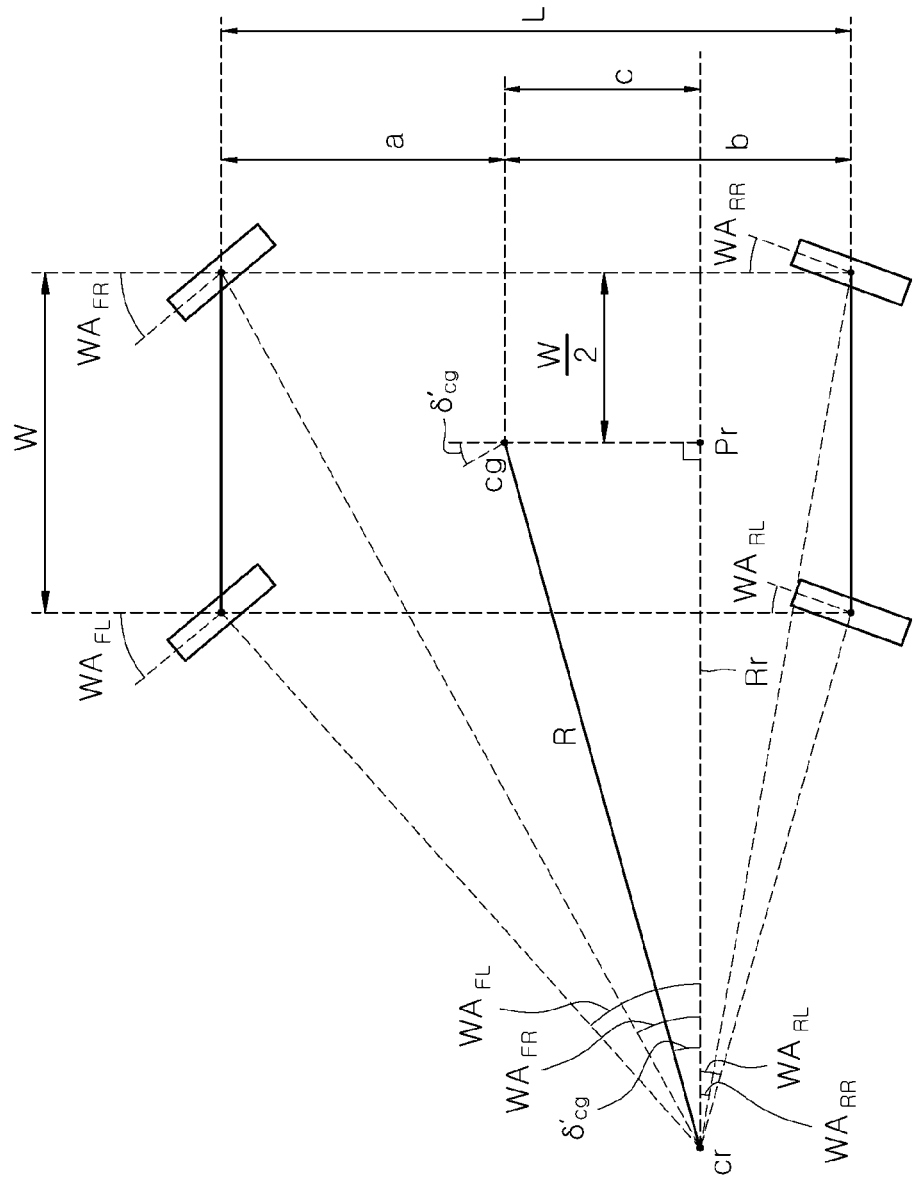
Figure 7:
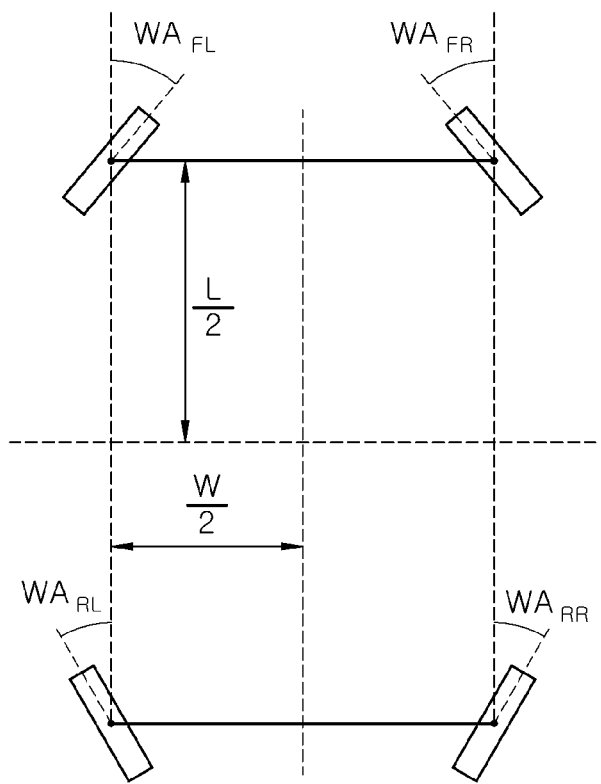
FIG. 7 is a diagram illustrating a process in which the four-wheel steering control apparatus in accordance with the present embodiment calculates target angles in an in-place turning mode.
Figure 8:
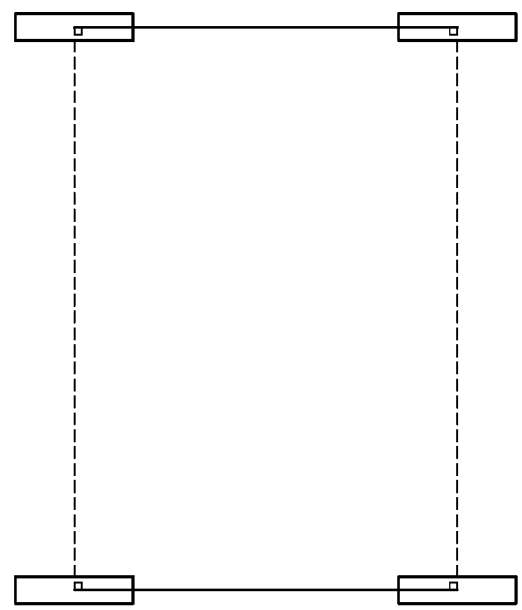
FIG. 8 is a diagram illustrating a process in which the four-wheel steering control apparatus in accordance with the present embodiment calculates target angles in a parallel mode.
Figure 9:
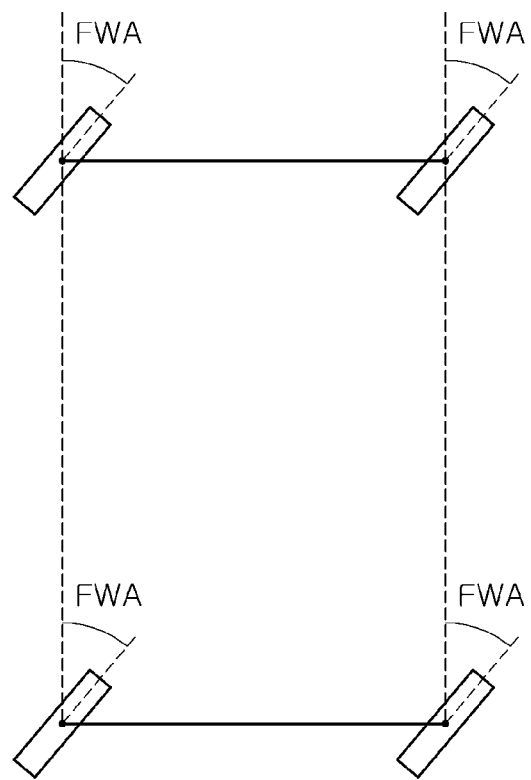
FIG. 9 is a diagram illustrating a process in which the four-wheel steering control apparatus in accordance with the present embodiment calculates target angles in a diagonal mode.

FIG. 1 is a block diagram illustrating a four-wheel steering control apparatus in accordance with the present embodiment, FIG. 2 is a diagram illustrating a process in which the four-wheel steering control apparatus in accordance with the present embodiment calculates a turning radius by using a Bicycle model, FIG. 3 and FIG. 4 are diagrams illustrating a process in which the four-wheel steering control apparatus in accordance with the present embodiment calculates a rotation angle, FIG. 5 and FIG. 6 are diagrams illustrating a process in which the four-wheel steering control apparatus in accordance with the present embodiment calculates target angles, FIG. 7 is a diagram illustrating a process in which the four-wheel steering control apparatus in accordance with the present embodiment calculates target angles in an in-place turning mode, FIG. 8 is a diagram illustrating a process in which the four-wheel steering control apparatus in accordance with the present embodiment calculates target angles in a parallel mode, and FIG. 9 is a diagram illustrating a process in which the four-wheel steering control apparatus in accordance with the present embodiment calculates target angles in a diagonal mode.

Referring to FIG. 1, the four-wheel steering control apparatus in accordance with the present embodiment may include a command front wheel angle acquisition unit 100 (may also be referred to as "angle acquirer 100"), a steering mode determination unit 200 (may also be referred to as "steering mode determiner 200"), a four-wheel target angle calculation unit 300 (may also be referred to as "four-wheel target angle calculator 300"), and a control unit 400 (may also be referred to as "controller 400").

The command front wheel angle acquisition unit 100 may acquire a command front wheel angle FWA by applying a total gear ratio (TGR) of a steering gear ratio variable device to a steering angle formed through steering of a driver with respect to a steering wheel or a steering angle command input from an ADAS system. The acquired command front wheel angle FWA serves as a basic parameter in calculating target angles $WA_{FL}$, $WA_{FR}$, $WA_{RL}$, and $WA_{RR}$ to be described below.

The steering mode determination unit 200 may determine any one of a general mode, an in-place turning mode, a parallel mode, and a diagonal mode as a steering mode for independently controlling the steering of four wheels mounted on a vehicle. The steering mode may be determined by a driver's manipulation of a predetermined switch provided inside the vehicle, or by a CAN signal input from an external system.

The four-wheel target angle calculation unit 300 may operate to determine the target angles $WA_{FL}$, $WA_{FR}$, $WA_{RL}$, and $WA_{RR}$ of the four wheels in a differential method according to the steering mode determined by the steering mode determination unit 200, and the control unit 400 may independently control the steering of the four wheels by using the respective target angles $WA_{FL}$, $WA_{FR}$, $WA_{RL}$, and $WA_{RR}$ calculated by the four-wheel target angle calculation unit 300. In the present embodiment, the target angles $WA_{FL}$, $WA_{FR}$, $WA_{RL}$, and $WA_{RR}$ correspond to angles formed between the longitudinal direction of the vehicle (for example, straight line direction connecting front and rear wheels) and the wheels.

Hereinafter, a process in which the four-wheel target angle calculation unit 300 calculates the target angles $WA_{FL}$, $WA_{FR}$, $WA_{RL}$, and $WA_{RR}$ in each steering mode will be described in detail, and when the definition of terms is particularly required, the term 'reference' will be used.

1. General Mode
1-1. Turning Radius Calculation

As illustrated in FIG. 2, the four-wheel target angle calculation unit 300 may calculate a turning radius R, which is a distance from the center cr of rotation when the vehicle is turning to the center cg of gravity of the Bicycle model defined for the vehicle, by using the Bicycle model in a state in which a front wheel angle of the Bicycle model is simulated as the command front wheel angle FWA. That is, in the present embodiment, as a basic model for calculating the target angles $WA_{FL}$, $WA_{FR}$, $WA_{RL}$, and $WA_{RR}$ to be described below, the Bicycle model, in which two front wheels and two rear wheels are each modeled as one wheel, is used.

As illustrated in FIG. 2, the turning radius R may be calculated on the premise that rear wheels are in a neutral state in the Bicycle model, and when a foot of a perpendicular drawn from the center cr of rotation to a straight line connecting front and rear axles in the Bicycle model is defined as a target point $P_t$, the distance $R_t$ between the center cr of rotation and the target point Pt may be expressed by Equation 1 below.

$$R_t = \frac{L}{\tan(abs(FWA))} \quad \text{Equation 1}$$

In Equation 1 above, L denotes the distance from the front axle to the rear axle in the Bicycle model (substantially equal to the distance from a front axle to a rear axle of the vehicle), and FWA denotes the command front wheel angle.

Furthermore, when the rear wheels are in a neutral state in the Bicycle model, a reference rotation angle $\delta_{cg}$ at the center cg of gravity of the Bicycle model (denoted as a reference rotation angle in order to be distinguished from a rotation angle $\delta'_{cg}$ to be described below) may be expressed by Equation 2 below.

$$\delta_{cg} = \tan^{-1}\left(\frac{b}{R_t}\right) \quad \text{Equation 2}$$

In Equation 2 above, b denotes the distance from the rear axle to the center cg of gravity of the Bicycle model.

From the Bicycle model in FIG. 2 and Equations 1 and 2 above, the turning radius R, which is a distance from the center cr of rotation when the vehicle is turning to the center cg of gravity of the Bicycle model, may be expressed by Equation 3 below.

$$R = \frac{R_t}{\cos\delta_{cg}} = \frac{L}{\cos\delta_{cg} \cdot \tan(abs(FWA))} \quad \text{Equation 3}$$

According to Equation 3 above, the turning radius R may be calculated on the basis of the distance L between the front axle and the rear axle of the Bicycle model, the reference rotation angle $\delta_{cg}$ at the center cg of gravity of the Bicycle model when the rear wheels are in a neutral state in the Bicycle model, and the command front wheel angle FWA.

1-2. Rotation Angle Calculation

The four-wheel target angle calculation unit 300 may calculate the rotation angle $\delta'_{cg}$ at the center cg of gravity of the Bicycle model (that is, angle between a straight line connecting the center cr of rotation and a reference point $P_r$ to be described below and a straight line indicating the turning radius R) on the basis of the ratio $K_{ss}$ of rotation angles of the front and rear wheels of the vehicle (hereinafter, rotation angle ratio) calculated from vehicle state parameters.

First, the rotation angle ratio $K_{ss}$ is a ratio between a front wheel angle $\delta_f$ and a rear wheel angle $\delta_r$ in the Bicycle model, and may be expressed by Equation 4 below.

$$K_{ss} = \frac{\delta_r}{\delta_f} \quad \text{Equation 4}$$

The rotation angle ratio Kss may be calculated for allowing a side-slip angle to be 0 at a specific vehicle speed, and may be expressed by Equation 5 below by using vehicle state parameters illustrated in Table 1 below. In Table 1, a vehicle speed may be acquired through a vehicle speed sensor of the vehicle, and a vehicle mass, a yaw moment of inertia, a distance from the front axle to the center gravity cg, a distance from the rear axle to the center gravity cg, a front cornering coefficient, and a rear cornering coefficient may be predefined in the four-wheel target angle calculation unit 300.

TABLE 1

| | |
|---|---|
| V | Vehicle Speed |
| M | Vehicle Mass |
| I | Yaw moment of Inertia |
| Lf | Distance from front axle to C.G |
| Lr | Distance from rear axle to C.G |
| Cf | Front conering coefficient |
| Cr | Rear conering coefficient |

$$Kss = \frac{BG - FC}{FD - BH} \quad \text{Equation 5}$$

-continued where $$B = \frac{C_r L_r - C_f L_f}{mV^2} - 1 \quad C = \frac{C_f}{mV}$$

$$D = \frac{C_r}{mV} \quad F = -\left(\frac{C_f L_f^2 + C_r L_r^2}{IV}\right)$$

$$G = \frac{C_f L_f}{I} \quad H = -\frac{C_r L_r}{I}$$

When the rotation angle ratio $K_{ss}$ is calculated, the four-wheel target angle calculation unit 300 determines whether the front wheels and the rear wheels of the Bicycle model are in-phase or opposite phase through the rotation angle ratio $K_{ss}$. That is, when the rotation angle ratio $K_{ss}$ is greater than 0, the four-wheel target angle calculation unit 300 determines that the front wheels and the rear wheels are in-phase (steering directions of the front wheels and the rear wheels are in substantially the same), and when the rotation angle ratio $K_{ss}$ is smaller than 0, the four-wheel target angle calculation unit 300 determines that the front wheels and the rear wheels are in opposite phase (steering directions of the front wheels and the rear wheels are opposite).

The four-wheel target angle calculation unit 300 may establish a reference front wheel angle $\delta_f$ and a reference rear wheel angle $\delta_r$ through first and second parameters in the Bicycle model. When the foot of the perpendicular drawn from the center cr of rotation to the straight line connecting the front and rear axles in the Bicycle model is defined as a reference point $P_r$, the first parameters may include a distance a from the front axle to the center cg of gravity of the Bicycle model and a distance c from the center cg of gravity to the reference point $P_r$ in the Bicycle model, and the second parameters may include a distance b from the rear axle to the center cg of gravity of the Bicycle model and the distance c from the center cg of gravity to the reference point $P_r$ in the Bicycle model.

FIG. 3 illustrates an example of a process of calculating the rotation angle $\delta'_{cg}$ when the front wheels and the rear wheels of the Bicycle model are in-phase. Referring to FIG. 3, the aforementioned reference front wheel angle $\delta_f$ and reference rear wheel angle $\delta_r$ may be established through first parameters a and c and second parameters b and c according to Equation 6 below.

$$\delta_f = \tan^{-1}\left(\frac{a+c}{R_r}\right), \delta_r = \tan^{-1}\left(\frac{c-b}{R_r}\right) \quad \text{Equation 6}$$

In Equation 6 above, $R_r$ denotes a reference distance to be described below, and is not considered as a direct factor for calculating the rotation angle $\delta'_{cg}$ because it is removed in a process of calculating the rotation angle $\delta'_{cg}$ according to Equation 8 below.

Referring to FIG. 3, c of Equation 6 above may be expressed by Equation 7 below.

$$c = R \cdot \sin \delta'_{cg} \quad \text{Equation 7}$$

In Equation 7 above, R denotes a turning radius and $\delta'_{cg}$ denotes a rotation angle to be calculated.

When Equation 6 above is substituted into Equation 4 above, a relational expression such as Equation 8 below may be derived.

$$K_{ss} = \frac{\delta_r}{\delta_f} = \frac{\tan^{-1}\left(\frac{c-b}{R_r}\right)}{\tan^{-1}\left(\frac{a+c}{R_r}\right)} \approx \frac{\frac{c-b}{R_r}}{\frac{a+c}{R_r}} = \frac{c-b}{a+c} \quad \text{Equation 8}$$

When Equation 7 above is substituted into Equation 8 above, the rotation angle $\delta'_{cg}$ may be expressed by Equation 9 below.

$$\delta'_{cg} = \sin^{-1}\left(\frac{b + aK_{ss}}{R(1 - K_{ss})}\right) \quad \text{Equation 9}$$

FIG. 4 illustrates an example of a process of calculating the rotation angle $\delta'_{cg}$ when the front wheels and the rear wheels of the Bicycle model are in opposite phase. Equations 6 to 9 above are equally applied to the case of the opposite phase in FIG. 4. However, in the case of the opposite phase, since the distance c from the center cg of gravity to the reference point $P_r$ in the Bicycle model is smaller than the distance b from the rear axle to the center cg of gravity of the Bicycle model (c−b<0), the reference rear wheel angle $\delta_r$ of Equation 6 above and $K_{ss}$ of Equation 8 above have negative values, and thus the rotation angle $\delta'_{cg}$ according to Equation 9 above is calculated as different values in the case of in-phase and opposite phase, respectively.

1-3. Target Angle Calculation

As described above, the first parameters are defined to include the distance a from the front axle to the center cg of gravity of the Bicycle model and the distance c from the center cg of gravity to the reference point $P_r$ in the Bicycle model, and the second parameters are defined to include the distance b from the rear axle to the center cg of gravity of the Bicycle model and the distance c from the center cg of gravity to the reference point $P_r$ in the Bicycle model. Third parameters may be defined as additional parameters for calculating the target angles $WA_{FL}$, $WA_{FR}$, $WA_{RL}$, and $WA_{RR}$, and may be defined to include a reference distance $R_r$ calculated from the calculated turning radius R and rotation angle $\delta'_{cg}$, and a tread W of the vehicle.

FIG. 5 illustrates an example in which the case where the front wheels and the rear wheels of the Bicycle model are in-phase is expanded to a four-wheel model of a vehicle. Referring to FIG. 5, the reference distance $R_r$ may be expressed by Equation 10 below.

$$R_r = R \cdot \cos \delta'_{cg} \quad \text{Equation 10}$$

In Equation 10 above, R denotes a turning radius and $\delta'_{cg}$ denotes a rotation angle.

When the reference distance $R_r$ is calculated according to Equation 10 above, the four-wheel target angle calculation unit 300 may calculate the target angle $WA_{FL}$ of the left front wheel and the target angle $WA_{FR}$ of the right front wheel by using the first parameters a and c and the third parameters $R_r$ and W, and calculate the target angle $WA_{RL}$ of the left rear wheel and the target angle $WA_{RR}$ of the right rear wheel by using the second parameters b and c and the third parameters $R_r$ and W according to Equation 5 above. This may be expressed by Equation 11 below.

$$WA_{FL} = \tan^{-1}\left(\frac{a+c}{R_r - \frac{W}{2}}\right) \times \text{sign}(FWA) \quad \text{Equation 11}$$

-continued $$WA_{FR} = \tan^{-1}\left(\frac{a+c}{R_r + \frac{W}{2}}\right) \times \text{sign}(FWA)$$

$$WA_{RL} = \tan^{-1}\left(\frac{c-b}{R_r - \frac{W}{2}}\right) \times \text{sign}(FWA)$$

$$WA_{RR} = \tan^{-1}\left(\frac{c-b}{R_r + \frac{W}{2}}\right) \times \text{sign}(FWA)$$

In Equation 11 above, $WA_{FL}$ denotes the target angle of the left front wheel, $WA_{FR}$ denotes the target angle $WA_{FR}$ of the right front wheel, $WA_{RL}$ denotes the target angle of the left rear wheel, $WA_{RR}$ denotes the target angle of the right rear wheel, a denotes the distance from the front axle to the center cg of gravity of the Bicycle model, b denotes the distance from the rear axle to the center cg of gravity of the Bicycle model, c denotes the distance (Equation 7 above) from the center cg of gravity to the reference point $P_r$ in the Bicycle model, $R_r$ denotes the reference distance, and W denotes the tread.

FIG. 6 illustrates an example in which the case where the front wheels and the rear wheels of the Bicycle model are in opposite phase is expanded to a four-wheel model of a vehicle. Equations 10 and 11 above are equally applied to the case of the opposite phase in FIG. 6. However, in the case of the opposite phase, since the distance c from the center cg of gravity to the reference point $P_r$ in the Bicycle model is smaller than the distance b from the rear axle to the center cg of gravity of the Bicycle model (c−b<0), the target angles $WA_{FL}$, $WA_{FR}$, $WA_{RL}$, and $WA_{RR}$ according to Equation 11 above are calculated as different values in the case of in-phase and opposite phase, respectively.

2. In-Place Turning Mode

In the present embodiment, the in-place turning mode is defined as a mode in which the front-rear direction of the vehicle is changed to the longitudinal direction thereof while the center cr of rotation of the vehicle is kept fixed (that is, while the vehicle remains in place).

When the in-place turning mode is determined by the steering mode determination unit 200, the four-wheel target angle calculation unit 300 may calculate the respective target angles $WA_{FL}$, $WA_{FR}$, $WA_{RL}$, and $WA_{RR}$ of the four wheels on the basis of the distance L from the front axle to the rear axle of the vehicle and the tread W.

FIG. 7 illustrates the relationship among the respective target angles $WA_{FL}$, $WA_{FR}$, $WA_{RL}$, and $WA_{RR}$ of the four wheels, the distance L from the front axle to the rear axle of the vehicle, and the tread W in the in-place turning mode. Referring to FIG. 7, the respective target angles $WA_{FL}$, $WA_{FR}$, $WA_{RL}$, and $WA_{RR}$ of the four wheels of the in-place turning mode may be expressed by Equation 12 below.

$$WA_{FL} = WA_{RR} = \tan^{-1}\left(\frac{L}{W}\right)$$

$$WA_{FR} = WA_{RL} = \tan^{-1}\left(\frac{L}{W}\right)$$

Equation 12

In Equation 12 above, $WA_{FL}$ denotes the target angle of the left front wheel, $WA_{FR}$ denotes the target angle $WA_{FR}$ of the right front wheel, $WA_{RL}$ denotes the target angle of the left rear wheel, $WA_{RR}$ denotes the target angle of the right rear wheel, L denotes the distance from the front axle to the rear axle of the vehicle, and W denotes the tread.

3. Parallel Mode

In the present embodiment, the parallel mode is defined as a mode in which the vehicle moves in a transverse direction perpendicular to the longitudinal direction of the vehicle. FIG. 8 illustrates the arrangement of the four wheels in the parallel mode. Referring to FIG. 8, the four-wheel target angle calculation unit 300 may calculate the absolute values of the respective target angles $WA_{FL}$, $WA_{FR}$, $WA_{RL}$, and $WA_{RR}$ of the four wheels as 90° (that is, $|WA_{FL}|=|WA_{FR}|=|WA_{RL}|=|WA_{RR}|=90°$.

4. Diagonal Mode

In the present embodiment, the diagonal mode is defined as a mode in which the vehicle moves in a diagonal direction. FIG. 9 illustrates the arrangement of the four wheels in the diagonal mode. Referring to FIG. 9, the four-wheel target angle calculation unit 300 may calculate the respective target angles $WA_{FL}$, $WA_{FR}$, $WA_{RL}$, and $WA_{RR}$ of the four wheels as the command front wheel angle FWA acquired by the command front wheel angle acquisition unit 100.

Figure 10:
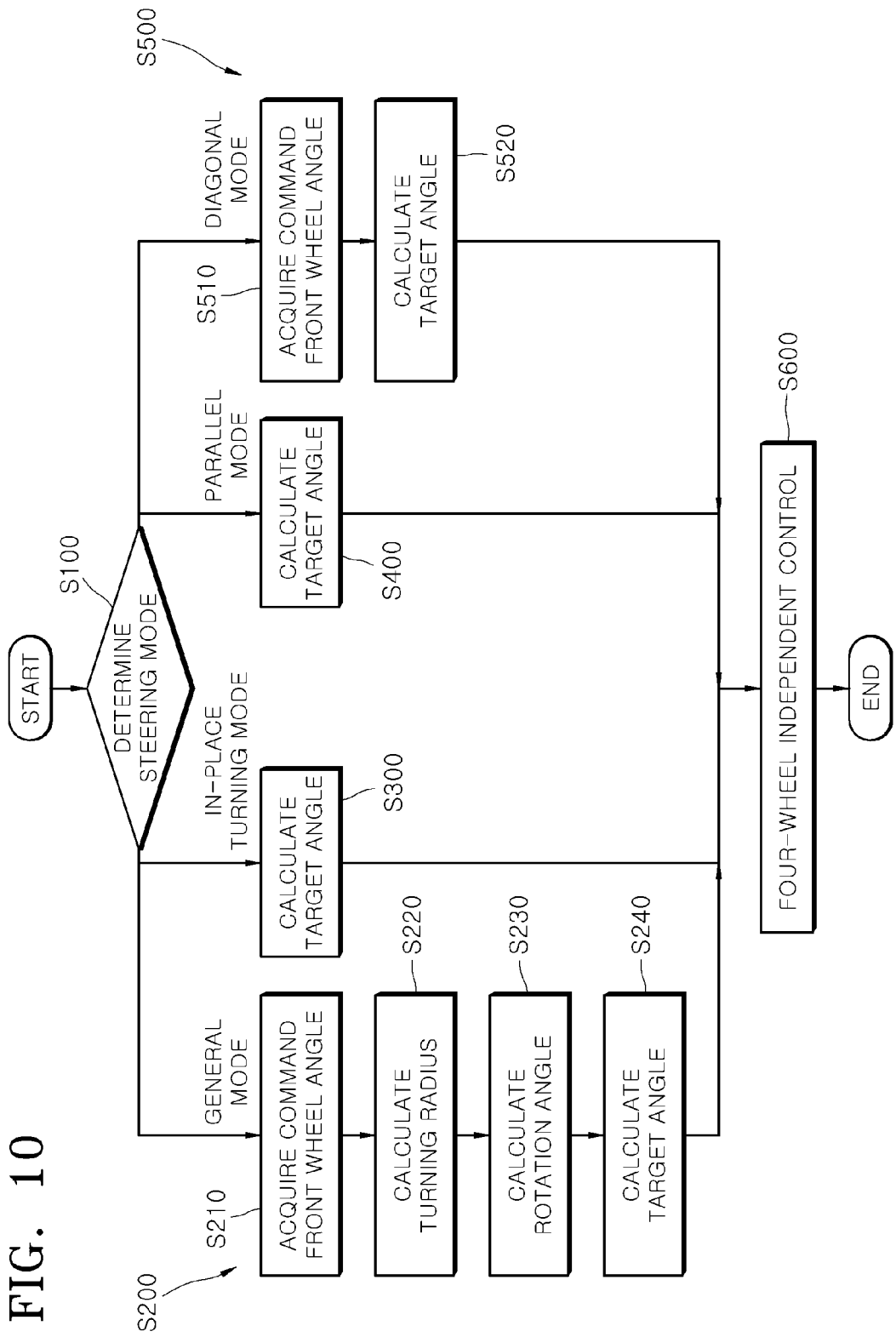
FIG. 10 is a flowchart illustrating a method for four-wheel steering control in accordance with the present embodiment.

FIG. 10 is a flowchart illustrating a method for four-wheel steering control in accordance with the present embodiment. The method for four-wheel steering control of the present embodiment will be described with reference to FIG. 10, detailed description for parts overlapping the aforementioned content will be omitted, and a time-series configuration will be mainly described.

First, the steering mode determination unit 200 determines any one of the general mode, the in-place turning mode, the parallel mode, and the diagonal mode as a steering mode for controlling the steering of the four wheels mounted on the vehicle according to a driver's manipulation of a predetermined switch provided inside the vehicle, or a CAN signal input from an external system (S100).

In step S100, when the general mode is determined as the steering mode, step S200 is started and the command front wheel angle acquisition unit 100 acquires the command front wheel angle FWA (S210).

Subsequently, the four-wheel target angle calculation unit 300 calculates the turning radius R, which is a distance from the center cr of rotation when the vehicle is turning to the center cg of gravity of the Bicycle model defined for the vehicle, by using the Bicycle model in a state in which the front wheel angle of the Bicycle model is simulated as the command front wheel angle FWA (S220). In step S220, the four-wheel target angle calculation unit 300 calculates the turning radius R on the basis of the distance L to the front axle to the rear axle in the Bicycle model, the reference rotation angle $\delta_{cg}$ at the center cg of gravity of the Bicycle model when the rear wheels are in a neutral state in the Bicycle model, and the command front wheel angle FWA.

Subsequently, the four-wheel target angle calculation unit 300 calculates the rotation angle $\delta'_{cg}$ at the center cg of gravity of the Bicycle model on the basis of the ratio $K_{ss}$ of the rotation angles of the front and rear wheels of the vehicle calculated from the vehicle state parameters (S230).

In step S230, the four-wheel target angle calculation unit 300 calculates the rotation angle $\delta'_{cg}$ at the center cg of gravity of the Bicycle model by using the reference front wheel angle $\delta_f$ and the reference rear wheel angle $\delta_r$ respectively established through the first and second parameters in the Bicycle model, and the rotation angle ratio $K_{ss}$. In such a case, when the foot of the perpendicular drawn from the center cr of rotation to the straight line connecting the front and rear axles in the Bicycle model is defined as the reference point $P_r$, the first parameters are defined to include the distance a from the front axle to the center cg of gravity of the Bicycle model and the distance c from the center cg of gravity to the reference point $P_r$ in the Bicycle model, and the second parameters are defined to include the distance b from the rear axle to the center cg of gravity of the Bicycle model and the distance c from the center cg of gravity to the reference point $P_r$ in the Bicycle model. Accordingly, the rotation angle $\delta'_{cg}$ is calculated through Equations 4 to 9 above, and is calculated as different values according to whether the front wheels and the rear wheels of the Bicycle model are in-phase or opposite phase determined through the rotation angle ratio $K_{ss}$.

After step S230, the four-wheel target angle calculation unit 300 calculates the target angles $WA_{FL}$, $WA_{FR}$, $WA_{RL}$, and $WA_{RR}$ of the four wheels on the basis of the turning radius R calculated in step S220 and the rotation angle $\delta'_{cg}$ calculated in step S230 (S240).

In step S240, the four-wheel target angle calculation unit 300 calculates the target angle $WA_{FL}$ of the left front wheel and the target angle $WA_{FR}$ of the right front wheel by using the first parameters and the third parameters, and calculates the target angle $WA_{RL}$ of the left rear wheel and the target angle $WA_{RR}$ of the right rear wheel by using the second parameters and the third parameters. The third parameters are defined to include the reference distance $R_r$ calculated from the turning radius R and the rotation angle $\delta'_{cg}$, and the tread W of the vehicle. Accordingly, in step S240, the four-wheel target angle calculation unit 300 calculates the respective target angles $WA_{FL}$, $WA_{FR}$, $WA_{RL}$, and $WA_{RR}$ of the four wheels according to Equation 11 above.

Meanwhile, in step S100, when the in-place turning mode is determined as the steering mode, the four-wheel target angle calculation unit 300 calculates the respective target angles $WA_{FL}$, $WA_{FR}$, $WA_{RL}$, and $WA_{RR}$ of the four wheels on the basis of the distance L from the front axle to the rear axle of the vehicle and the tread W (S300).

Furthermore, in step S100, when the parallel mode is determined as the steering mode, the four-wheel target angle calculation unit 300 calculates the absolute values of the respective target angles $WA_{FL}$, $WA_{FR}$, $WA_{RL}$, and $WA_{RR}$ of the four wheels as 90° (S400).

Furthermore, in step S100, when the diagonal mode is determined as the steering mode, step S500 is started and the command front wheel angle acquisition unit 100 acquires the command front wheel angle FWA (S510), and the four-wheel target angle calculation unit 300 calculates the respective target angles $WA_{FL}$, $WA_{FR}$, $WA_{RL}$, and $WA_{RR}$ of the four wheels as the command front wheel angle FWA acquired in step S510 (S520).

When the respective target angles $WA_{FL}$, $WA_{FR}$, $WA_{RL}$, and $WA_{RR}$ of the four wheels are calculated through step S200, step S300, step S400, or step S500, the control unit 400 independently controls the steering of the four wheels by using the calculated respective target angles $WA_{FL}$, $WA_{FR}$, $WA_{RL}$, and $WA_{RR}$ (S600).

In accordance with an aspect of the present disclosure, a control mechanism capable of independently controlling the steering of four wheels is proposed. Therefore, it is possible to provide a vehicle driving control mechanism capable of minimizing the slip of a vehicle while having substantially the same turning radius as that of two-wheel steering. Furthermore, since not only front-wheel steering but also rear-wheel steering are considered, it is possible to reduce a side-slip angle compared to the front-wheel steering in the related art, thereby improving driving stability. Furthermore, it is possible to enable special driving such as parallel driving, diagonal driving, and turning in place through four-wheel independent steering, the special driving being impossible with two-wheel steering.

As described above, there is provided a four-wheel steering control apparatus and method using a control mechanism capable of minimizing the slip of a vehicle while having substantially the same turning radius as that of two-wheel steering and independently controlling the steering of four wheels.

As described above, a control mechanism capable of independently controlling the steering of four wheels is proposed. Therefore, it is possible to provide a vehicle driving control mechanism capable of minimizing the slip of a vehicle while having substantially the same turning radius as that of two-wheel steering. Furthermore, since not only front-wheel steering but also rear-wheel steering are considered, it is possible to reduce a side-slip angle compared to the front-wheel steering in the related art, thereby improving driving stability. Furthermore, it is possible to enable special driving such as parallel driving, diagonal driving, and turning in place through four-wheel independent steering, the special driving being impossible with two-wheel steering.

The angle acquisition unit 100, angle acquirer 100, steering mode determination unit 200, steering mode determiner 200, four-wheel target angle calculation unit 300, four-wheel target angle calculator 300, control unit 400, controller 400, and other apparatuses, devices, units, modules, and components described herein are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, multiple-instruction multiple-data (MIMD) multiprocessing, a controller and an arithmetic logic unit (ALU), a DSP, a microcomputer, an application-specific integrated circuit (ASIC), a field programmable gate array (FPGA), a programmable logic unit (PLU), a central processing unit (CPU), a graphics processing unit (GPU), a neural processing unit (NPU), or any other device capable of responding to and executing instructions in a defined manner.

In an example, the processor includes a communication device such as a computer, a cellular phone, a portable/personal digital assistant (PDA), and other devices that facilitate communication of information between end users.

The methods that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

The software may include a computer program, a piece of code, an instruction, or some combination thereof, to independently or uniformly instruct or configure the processing device to operate as desired. Software and data may be embodied permanently or temporarily in any type of machine, component, physical or pseudo equipment, computer storage medium or device, or in a propagated signal wave capable of providing instructions or data to or being interpreted by the processing device. The software also may be distributed over network-coupled computer systems so that the software is stored and executed in a distributed fashion. The software and data may be stored by one or more non-transitory computer-readable recording mediums.

The Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In an example, the instructions or software includes at least one of an applet, a dynamic link library (DLL), middleware, firmware, a device driver, an application program storing the method for four-wheel steering control to independently control steering of four wheels mounted on a vehicle. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), magnetic RAM (MRAM), spin-transfer torque(STT)-MRAM, static random-access memory (SRAM), thyristor RAM (T-RAM), zero capacitor RAM (Z-RAM), twin transistor RAM (TTRAM), conductive bridging RAM(CBRAM), ferroelectric RAM (FeRAM), phase change RAM (PRAM), resistive RAM(RRAM), nanotube RRAM, polymer RAM (PoRAM), nano floating gate Memory(NFGM), holographic memory, molecular electronic memory device), insulator resistance change memory, dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and providing the instructions or software and any associated data, data files, and data structures to a processor or computer so that the processor or computer can execute the instructions. In an example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A four-wheel independent steering control apparatus for a vehicle, the apparatus comprising:
   a command front wheel angle acquirer configured to acquire a command front wheel angle;
   a four-wheel target angle calculator configured to:
      calculate a turning radius using a Bicycle model in a state in which a front wheel angle of the Bicycle model is simulated as the command front wheel angle;
      calculate a rotation angle at the center of gravity of the Bicycle model based on a ratio of rotation angles of front and rear wheels of a vehicle calculated from a state parameter of the vehicle; and
      calculate a target angle of each of four wheels of the vehicle based on the calculated turning radius and the calculated rotation angle; and
   a controller configured to independently control steering of the four wheels based on the calculated target angle of each of the wheels of the vehicle,
   wherein the calculated turning radius is a distance from a center of rotation when the vehicle is turning to a center of gravity in the Bicycle model defined for the vehicle, and
   wherein, in response to a foot of a perpendicular drawn from the center of rotation to a straight line connecting the front and rear axles in the Bicycle model being defined as a reference point, the rotation angle is an angle between a straight line connecting the center of rotation and the reference point and a straight line indicating the turning radius.

2. The apparatus according to claim 1, wherein the four-wheel target angle calculator is further configured to calculate the turning radius based on a distance from a front axle to a rear axle in the Bicycle model, a reference rotation angle at the center of gravity of the Bicycle model when the rear wheels are in a neutral state in the Bicycle model, and the command front wheel angle.

3. The apparatus according to claim 1,
   wherein the four-wheel target angle calculator is further configured to calculate the rotation angle at the center of gravity of the Bicycle model based on the ratio of the rotation angles, and a reference front wheel angle and a reference rear wheel angle respectively established through first and second parameters in the Bicycle model, and
   wherein the first parameters comprise a distance from the front axle to the center of gravity of the Bicycle model and a distance from the center of gravity to the reference point in the Bicycle model, and the second parameters comprise a distance from the rear axle to the center of gravity of the Bicycle model and the distance from the center of gravity to the reference point in the Bicycle model.

4. The apparatus according to claim 3, wherein the rotation angle at the center of gravity of the Bicycle model is calculated as different values according to whether the front wheels and the rear wheels of the Bicycle model are in-phase or opposite phase determined through the ratio of the rotation angles.

5. The apparatus according to claim 4,
   wherein the four-wheel target angle calculator is further configured to:
      calculate a target angle of a left front wheel and a target angle of a right front wheel based on the first parameters and third parameters;; and te
      calculate a target angle of a left rear wheel and a target angle of a right rear wheel based on the second parameters and the third parameters, and
   wherein the third parameters comprise a reference distance calculated from the calculated turning radius and the calculated rotation angle, and a tread of the vehicle.

6. The apparatus according to claim 5,
   wherein the four-wheel target angle calculator is further configured to calculate the target angle of each of the four wheels based on $$WA_{FL} = \tan^{-1}\left(\frac{a+c}{R_r - \frac{W}{2}}\right) \times \text{sign}(FWA)$$

$$WA_{FR} = \tan^{-1}\left(\frac{a+c}{R_r + \frac{W}{2}}\right) \times \text{sign}(FWA)$$

$$WA_{RL} = \tan^{-1}\left(\frac{c-b}{R_r - \frac{W}{2}}\right) \times \text{sign}(FWA)$$

$$WA_{RR} = \tan^{-1}\left(\frac{c-b}{R_r + \frac{W}{2}}\right) \times \text{sign}(FWA)$$

wherein WAFL is the target angle of the left front wheel, WAFR is the target angle of the right front wheel, WARL is the target angle of the left rear wheel, WARR is the target angle of the right rear wheel, a is the distance from the front axle to the center of gravity of the Bicycle model, b is the distance from the rear axle to the center of gravity of the Bicycle model, c is the distance from the center of gravity to the reference point in the Bicycle model, Rr is the reference distance, W is the tread, and $\alpha$ is a sign of the command front wheel angle.

7. The apparatus according to claim 1, further comprising:
   a steering mode determiner configured to determine any one of a general mode, an in-place turning mode, a parallel mode, and a diagonal mode as a steering mode for controlling the steering of the four wheels,
   wherein, in response to the general mode being determined by the steering mode determiner, the four-wheel target angle calculator is further configured to:
      calculate the turning radius;
      calculate the rotation angle at the center of gravity of the Bicycle model; and
      calculate the target angle of each of the four wheels.

8. The apparatus according to claim 7, wherein the four-wheel target angle calculator is further configured to calculate the target angle of each of the four wheels on the basis of a distance from a front axle to a rear axle of the vehicle and the tread, in response to the in-place turning mode being determined by the steering mode determiner.

9. The apparatus according to claim 7, wherein the four-wheel target angle calculator is further configured to calculate an absolute value of the target angle of each of the four wheels as 90°, in response to the parallel mode being determined by the steering mode determiner.

10. The apparatus according to claim 7, wherein the four-wheel target angle calculator is further configured to calculate the target angle of each of the four wheels as the command front wheel angle, in response to the diagonal mode being determined by the steering mode determiner.

11. A processor-implemented method for four-wheel independent steering control for a vehicle, the method comprising:
   acquiring, at a command front wheel angle acquirer, a command front wheel angle;
   calculating, at a four-wheel target angle calculator, a turning radius using a Bicycle model in a state in which a front wheel angle of the Bicycle model is simulated as the command front wheel angle;
   calculating, by the four-wheel target angle calculator, a rotation angle at the center of gravity of the Bicycle model based on a ratio of rotation angles of front and rear wheels of a vehicle calculated from a state parameter of the vehicle;
   calculating, by the four-wheel target angle calculator, a target angle of each of four wheels of the vehicle based on the calculated turning radius and the calculated rotation angle; and
   controlling, by a controller, steering of the four wheels based on the calculated target angle of each of the wheels of the vehicle,
   wherein the calculated turning radius is a distance from a center of rotation when the vehicle is turning to a center of gravity in a Bicycle model defined for the vehicle, and
   wherein, in response to a foot of a perpendicular drawn from the center of rotation to a straight line connecting the front and rear axles in the Bicycle model being defined as a reference point, the rotation angle is an angle between a straight line connecting the center of rotation and the reference point and a straight line indicating the turning radius.

12. The method according to claim 11, wherein, the calculating of the turning radius comprises calculating the turning radius based on the a distance from a front axle to a rear axle in the Bicycle model, a reference rotation angle at the center of gravity of the Bicycle model when the rear wheels are in a neutral state in the Bicycle model, and the command front wheel angle.

13. The method according to claim 11,
   wherein the calculating of the rotation angle comprises calculating, at the four-wheel target angle calculator, the rotation angle at the center of gravity of the Bicycle model using the ratio of the rotation angles, and a reference front wheel angle and a reference rear wheel angle respectively established through first and second parameters in the Bicycle model, and
   wherein the first parameters comprise a distance from the front axle to the center of gravity of the Bicycle model and a distance from the center of gravity to the reference point in the Bicycle model, and the second parameters comprise a distance from the rear axle to the center of gravity of the Bicycle model and the distance from the center of gravity to the reference point in the Bicycle model.

14. The method according to claim 13, wherein the rotation angle at the center of gravity of the Bicycle model is calculated as different values according to whether the front wheels and the rear wheels of the Bicycle model are in-phase or opposite phase determined through the ratio of the rotation angles.

15. The method according to claim 14,
   wherein calculating of the target angle comprises calculating, at the four-wheel target angle calculator, a target angle of a left front wheel and a target angle of a right front wheel by using the first parameters and third parameters, and calculating a target angle of a left rear wheel and a target angle of a right rear wheel using the second parameters and the third parameters, and
   wherein the third parameters comprise a reference distance calculated from the turning radius and the calculated rotation angle, and a tread of the vehicle.

16. The method according to claim 15,
   wherein the calculating of the target angle comprises calculating, at the four-wheel target angle calculator, the target angle of each of the four wheels based on $$WA_{FL} = \tan^{-1}\left(\frac{a+c}{R_r - \frac{W}{2}}\right) \times \text{sign}(FWA)$$

$$WA_{FR} = \tan^{-1}\left(\frac{a+c}{R_r + \frac{W}{2}}\right) \times \text{sign}(FWA)$$

$$WA_{RL} = \tan^{-1}\left(\frac{c-b}{R_r - \frac{W}{2}}\right) \times \text{sign}(FWA)$$

$$WA_{RR} = \tan^{-1}\left(\frac{c-b}{R_r + \frac{W}{2}}\right) \times \text{sign}(FWA)$$

wherein WAFL is the target angle of the left front wheel, WAFR is the target angle of the right front wheel, WARL is the target angle of the left rear wheel, WARR is the target angle of the right rear wheel, a is the distance from the front axle to the center of gravity of the Bicycle model, b is the distance from the rear axle to the center of gravity of the Bicycle model, c is the distance from the center of gravity to the reference point in the Bicycle model, Rr is the reference distance, W is the tread, and $\alpha$ is a sign of the command front wheel angle.

17. The method according to claim 11, further comprising:
   determining, at a steering mode determiner, any one of a general mode, an in-place turning mode, a parallel mode, and a diagonal mode as a steering mode for controlling the steering of the four wheels,
   wherein the calculating of the turning radius, the calculating of the rotation angle, and the calculating of the target angle comprises calculating the turning radius, calculating the rotation angle, and calculating of the target angle, in response to the general mode being determined by the steering mode determiner.

18. The method according to claim 17, further comprising:
   calculating, at the four-wheel target angle calculator, the target angle of each of the four wheels on the basis of a distance from a front axle to a rear axle of the vehicle and the tread, in response the in-place turning mode being determined by the steering mode determiner.

19. The method according to claim 17, further comprising:
   calculating, at the four-wheel target angle calculator, an absolute value of the target angle of each of the four wheels as 90°, in response to the parallel mode being determined by the steering mode determiner.

20. The method according to claim 17, further comprising:
   calculating, at the four-wheel target angle calculator, the target angle of each of the four wheels as the command front wheel angle, in response to the diagonal mode being determined by the steering mode determiner.

* * * * *